United States Patent [19]
O'Mara

[11] Patent Number: 5,621,207
[45] Date of Patent: Apr. 15, 1997

[54] OPTICAL JOYSTICK USING A PLURALITY OF MULTIPLEXED PHOTOEMITTERS AND A CORRESPONDING PHOTODETECTOR

[75] Inventor: Kerry D. O'Mara, Florence, N.J.

[73] Assignee: Hasbro, Inc., Pawtucket, R.I.

[21] Appl. No.: 297,642

[22] Filed: Aug. 29, 1994

[51] Int. Cl.$^6$ ........................................... H01J 40/14
[52] U.S. Cl. ................. 250/221; 250/229; 250/231.1; 346/89; 33/365
[58] Field of Search ........................ 250/221, 229, 250/231.1, 214 PN, 222.1; 345/161, 167; 340/689; 33/365

[56] References Cited

U.S. PATENT DOCUMENTS

| | | |
|---|---|---|
| 4,250,380 | 2/1981 | Iyeta . |
| 4,533,827 | 8/1985 | Fincher ........................ 250/211 K |
| 4,607,159 | 8/1986 | Goodson et al. .................. 250/221 |
| 4,731,530 | 3/1988 | Mikan ............................. 250/229 |
| 4,748,323 | 5/1988 | Holiday ........................... 250/221 |
| 4,856,785 | 8/1989 | Lantz et al. ................... 273/148 B |
| 4,958,071 | 9/1990 | Scott-Jackson et al. ............ 250/229 |
| 4,994,669 | 2/1991 | Stern ............................. 250/229 |
| 5,009,501 | 4/1991 | Fenner et al. .................... 356/152 |
| 5,065,146 | 11/1991 | Garrett .......................... 345/161 |
| 5,117,102 | 5/1992 | Mitchell ......................... 250/229 |

*Primary Examiner*—Edward P. Westin
*Assistant Examiner*—Stephen Calogero
*Attorney, Agent, or Firm*—Hughes Hubbard & Reed LLP

[57] ABSTRACT

An electro-optical input device for computers or electronic games which uses electro-optical elements to sense input from a user. A user actuation element, such as a directional control pad or a joystick is pivotally disposed on a printed circuit board. Two photoemitters are mounted on the printed circuit board, at or near the circumference of the footprint described by the user actuation element. The photoemitters are positioned 90° apart, one along the North-South axis of flit of the actuation element, and one along the East-West axis. At least one photodetector is mounted to the base at or near the pivot point of the actuation element so that it can receive light from both of the photoemitters. A skirt or flange depends annularly from the actuation element, at or near its periphery, positioned between the photodetector and the photoemitters. As a user applies a force to one side of the actuation element, the annular flange will be displaced and act as a light shutter, either blocking the light from the photoemitters or allowing the photodetector to receive a greater amount of light. By comparing the amount of light received from each of the North and West photoemitters when a force is applied, to the amount of light normally received from these photoemitters when the actuation element is in its neutral position, the input device is able to determine both the direction and magnitude of the force applied by the user.

17 Claims, 7 Drawing Sheets

FIG. 6
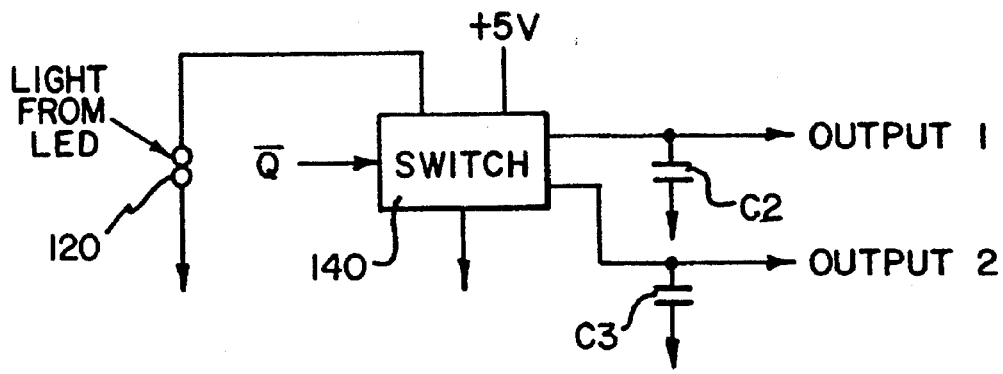
FIG. 7
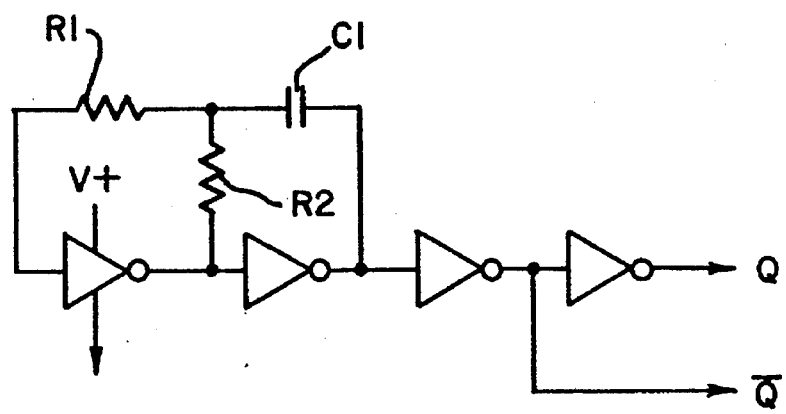
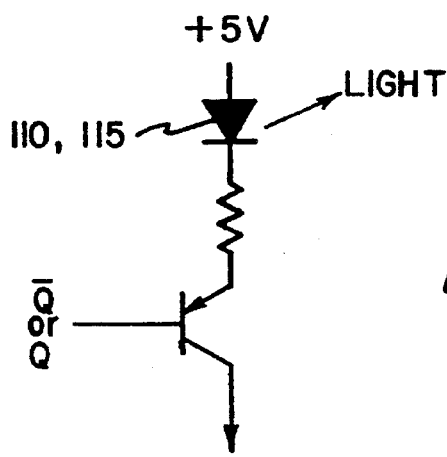
FIG. 8

OPTICAL JOYSTICK USING A PLURALITY OF MULTIPLEXED PHOTOEMITTERS AND A CORRESPONDING PHOTODETECTOR

FIELD OF INVENTION

This invention generally relates to input control devices, and more particularly to analog joysticks or directional control pads which use electro-optical devices to effect control.

BACKGROUND OF THE INVENTION

A joystick is a well-known mechanical actuator for a device that can be used to provide control input to electronic games and computers. Another, similar device is sometimes referred to as a directional control pad ("DCP"). A DCP device generally has an active area, usually circular, and is typically about one and a half inches in diameter. Application of pressure at various angular positions on the active area of a DCP produces a corresponding electrical output signal, Most inexpensive controllers, of either the joystick or DCP type, provide only limited, coarse, output signals. This is due to the fact that these devices generate their output signals by the use of four momentary switches. Typically, four leaf switches or conductive rubber dome switches are used for end point detection in each of four possible directions of motion of the actuator of the controller, e.g., "North", "South", "East" and "West" directions. In general, these switches are spaced 90° from each other around the periphery of the input device. In these devices, a given amount of motion solely in the "North" direction, for example, causes the closure of only the single switch used to detect motion in this direction. The same is true for motions exclusively in the "South", "East", and "West" directions. Motion of the joystick in a "North-East" direction,: can cause simultaneous closure of both the "North" and "East" switches. Likewise, dual switch closures will occur for joystick motion in the "North-West", "South-East", and "South-West" directions. Thus, there are only eight directions which can be represented by unique output states of such a simple device. Furthermore, in devices which use momentary switches, the output of the device merely indicates a switch being "on" or "off" and the output signal does not indicates a magnitude in that direction.

One significant problem with the electromechanical devices as described above is that they are subject to an increase in the resistance of the switch contacts due to, for example, wear, misalignment, oxidation, and accumulation of dirt. As the contact resistance increases, the switch begins to fail on an intermittent basis. Intermittent failures of an input controller are particularly unacceptable in a game environment where split second reactions by a user are often required. Devices based upon mechanical switches also suffer from the inherent variations from one switch to another, such as the gap between contacts and spring stiffness. These variations will result in inconsistent and uneven position indication from the control device, and provide inadequate sensitivity for certain applications of the device. Additionally, mechanical switches are also subject to switch bounce in which the output of the switch will oscillate between its "on" and "off" voltages for several milliseconds after being switched.

Some prior art input devices have used electro-optical mechanisms to detect the actions of the user. Mitchell, U.S. Pat. No. 5,117,102 describes relative motion detection device for a joystick which contains Light Emitting Diodes (LEDs) and optical detectors which are diametrically opposed about the shaft of the joystick. As the joystick is moved, the shaft itself blocks; the light from the LEDs and thus, the action of the user is, detected. Another typical prior art method of detection is disclosed in U.S. Pat. No. 4,748,323 to Holiday. In the joystick device taught in this patent, a circular disk is coaxially mounted on the lower portion of the shaft of the joystick. Four LED/detector pairs are mounted on C shaped blocks. Light from the LED to the detector passes parallel to the shaft's neutral position. As the shaft is tilted, the disk enters the open end of the C shaped blocks and occludes the light from the LED. Each of these prior art devices suffers from at least three problems. First, the simpler embodiments of these devices do not provide adequate resolution! of! the motion joystick and can only report. gross motions. Second, to attain a greater resolution, a greater number of component parts are required which increases the manufacturing cost of such a device. Finally, as more LED and detector combinations are added to these devices, the need to create light baffling between the light sources and light detectors is required.

It is therefore one object of the present invention to provide a practically infinite resolution of the angular direction of the motion or force applied to an input controller. It is an additional object of the present invention to indicate the amplitude of the motion or force applied in a specific direction. It is also an object of the present invention to decrease the cost of producing an analog control device. It is a further object of the invention to increase the resilience of an input device to conventional wear.

SUMMARY OF THE INVENTION

The present invention is a novel input device for computers or electronic games which uses electro-optical elements to sense input from a user. A user actuation element, such as a directional control pad ("DCP") or a joystick is pivotally disposed on a base (e.g., a printed circuit board). In the preferred embodiment, the DCP or the base of the joystick has a circular footprint, with the pivot point of the actuator residing at the center of the circle. Two photoemitters (e.g., a Light Emitting Diode, "LED") are mounted on the base, at or near the circumference of the circle described by the user actuation element. The photoemitters are positioned 90° apart, one along the North-South axis of tilt of the actuation element, and one along the East-West axis. At least one photodetector is mounted to the base at or near the pivot point of the actuation element. The photodetector is positioned so that it can receive light from both of the photoemitters. A skirt or flange depends annularly from the actuation element, at or near its periphery. The flange is positioned (in a radial direction from the pivot point to the periphery of the actuation element) between the photodetector and the photoemitters. A biasing means such as a spring, foam, or rubber element is positioned between the actuation element and the housing of the input device. The biasing means supports the actuation element in a neutral position when no force is being applied by a user, and it also functions to return the activation device to this neutral position after a user's force is removed. When the actuation element is in its neutral position, the flange or skirt will block at least some of the light from the photoemitters from reaching the photodetector.

In operation, as a user applies a force to one side of the actuation element, the annular flange depending from the actuation element on this side of the actuation element is forced toward the base, while the portion of the flange on the opposite side of the actuation element is forced away from the base. If one of the photoemitter/photodetector combinations is at or near the point on the actuation element where the force is being applied, the flange on this side of the actuation element will prevent some portion of the light from the photoemitter from reaching the photodetector. Conversely, if one of the photoemitter/photodetector combinations is on the opposite side of the actuation element from where the force is being applied, the flange in this area allows the photodetector to receive a greater amount light than it normally receives when the actuator is in its neutral position.

By comparing the amount of light received from each of the North and West photoemitters when a force is applied, to the amount of light normally received from these photoemitters when the actuation element is in its neutral position, the input device is able to determine both the direction and magnitude of the force applied by the user.

For example, in the preferred embodiment of the present invention, one LED is positioned on the base corresponding to the North direction of a compass. A second LED is placed 90° away, in a position in the West direction. Each of the LEDs faces directly inward (along a radial line) toward the pivot point of the actuation element. The photodetector is mounted to the base near the pivot point of the actuation element. The photodetector is mounted to the base so that it faces the North-West direction, at a 45 degree angle to either of the LEDs. If the user applies a force to an area of the actuation element solely in the North direction, the portion of the flange in this area reduces the amount of light from the North LED which is received by the photodetector. The diminution in the amount of light from the North LED is directly in proportion to the amount of force applied by the user. Assuming the actuator element possesses ideal mechanical characteristics, in this example there will be no change in the amount of light received by the photodetector detecting light from the LED in the West position. The portion of the actuator element flange which is south of the axis of rotation will allow more light from the West LED to pass, while the portion of the flange which is north of the axis will block an equal amount of light. The net result is that the photodetector will receive the same amount of light from the West LED as it does when the actuator element is in its neutral position.

BRIEF DESCRIPTION OF THE DRAWINGS

FIG. 6 is a circuit diagram depicting the inputs and outputs to the synchronous switch of the present invention.

FIG. 7 is a circuit diagram of the clock and gating signal generation circuit.

FIG. 8 is a circuit diagram of a sample photoemitter driving circuit.

DETAILED DESCRIPTION OF THE PREFERRED EMBODIMENTS

Figure 1:
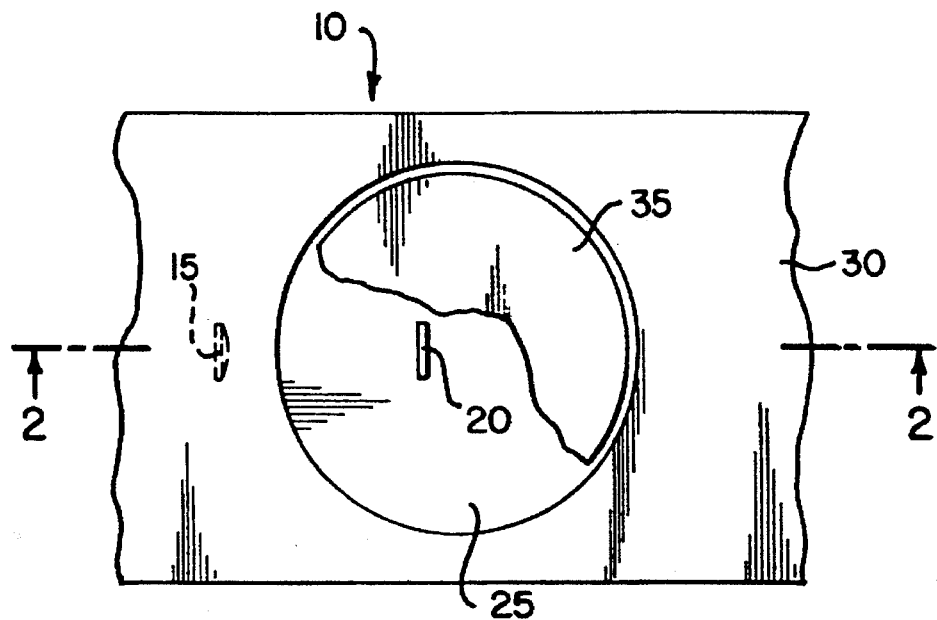
FIG. 1 is a plan view and partial cut away of a device constructed according to the present invention.

FIG. 1 is a plan view and partial cross section of a device 10 constructed according to the present invention. Device 10 can be used as an input device, for example, to a computer (e.g., as cursor control) or to an electronic game. Depicted in FIG. 1 are a photoemitter 15, a photodetector 20, a base 25, a device housing 30, and a partial cut away of a directional control pad or actuation disk 35. Disk 35 is circular in construction and is approximately one and a half inches in diameter. The circular design of disk 35 shown in this Figure is merely one embodiment of the present invention. Disk 35 can be constructed as a square, oval or any desired shape. Disk 35 is an actuation device used to accept input, in the form of a force applied by a user, when the user wishes to effect control on a system (not shown) to which device 10 is attached. In the construction of disk 35 shown in FIG. 1, a user can apply a force using her or his fingers directly on the surface of disk 35. Alternatively, a joystick (not shown) could be mounted to the top of disk 35 to aid in a user's actuation of device 10. As a result of a user applying a force to actuation disk 35, the disk is displaced or tilted in the direction of the force. The detecting elements of device 10 (described below) actually measure the displacement of disk 35 from its neutral position in order to calculate the magnitude and direction of the force applied by a user.

Base 25, to which photoemitter 15 and photodetector 20 are mounted, can be constructed of any suitable material such as low cost FR4, printed circuit board substrate material, or any suitable plastic material. In the preferred embodiment of the present invention, base 25 is a circuit board to which the inputs and outputs (not shown) of photoemitter 15 and photodetector 20 are connected. Base 25 in the form of a circuit board contains all the necessary electrical components to make device 10 functional. In the electronic game embodiment of the present invention, circuit board 25 is generally located inside a hand-held game controller.

As viewed in FIG. 1, photoemitter 15 is mounted on base 25, under disk 35, in a position corresponding to the "West" position of a compass. The "North", "South", "East" and "West" directional notations for a compass will be used throughout this discussion to refer to the specific placement of photoemitters and photodetectors on base 25 relative to each other and to actuation element 35. In a preferred embodiment of the present invention, photoemitter 15 is a Light Emitting Diode (LED) such as the a low cost visible red LED from Liteon available through Digi-Key (part number LT1078-ND). LED 15 is preferably rectangular in design with a right angle beam. The current driving LED 15 is approximately 50 milliamps at 1.2 volts which yields a power of approximately 30 milliwatts at a 50% duty cycle (the duty cycle of photoemitter 15 in the preferred embodiment is described below). The optical output of emitter 15 required for the functionality of device 10 is so low that no thermal problems arise from the use of the emitter 15. That is to say, the drive current for an LED light source 15 can be kept well below its maximum allowable steady state value. At this power level, no problems with the strength of the output of photodetector 20 should be experienced. As the current input to LED 15 is reduced, its light output is reduced accordingly, as is the amount of light detected by photodetector 20. Problems will arise if the output of the photodetector come close to the noise level of device 10. Noise in device 10 can be caused by electromagnetic fields, thermal noise and ambient light which leaks into device 10.

Figure 2:
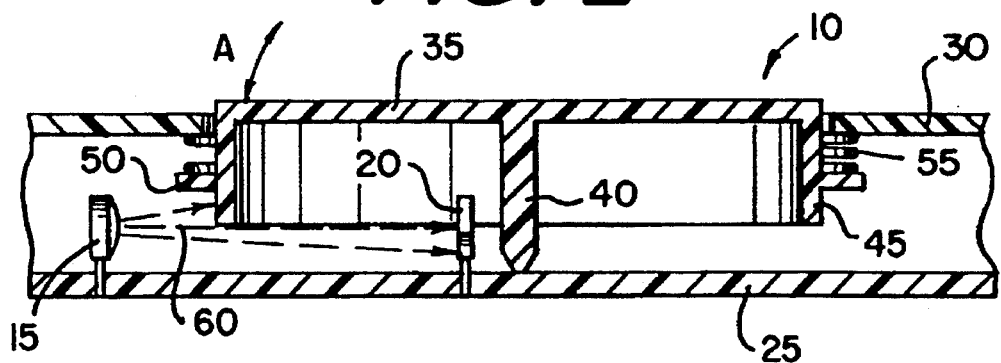
FIG. 2 is a cross section of the device of FIG. 1 taken along line 2—2.

Photodetector 20 is a detector which is suitable for accurately detecting the light from the particular photoemitter 15 chosen for input device 10. In the preferred embodiment described above (photoemitter 15 being an LED), a silicon solar cell is used as photodetector 20. One suitable silicon solar cell is part number BP-2510CASE from the Panasonic Corporation. The particular photodetector 20 chosen for device 10 should have very good sensitivity in the region of the electromagnetic spectrum which is output by photoemitter 15. The preferred photodetector 20 provides an analog output related to the amount of light which is incident on its receiving surface. In general, as the light level impinging on a solar cell 20 is increased, beginning at a very low intensity, a curve of the output of cell 20 has two regions. At low light intensity, the voltage across a solar cell 20 increases with increasing light. At higher light intensities, the voltage across the cell remains approximately constant, and the current increases with an increase in light intensity. Between these two regions is a transition zone. The low light intensities used in the present invention utilizes the "voltage" portion of a solar cell characteristic curve. As will be explained in greater detail later, the amount of light received by photodetector 20 is directly proportional to the amount of displacement of actuation disk 35 which is caused by:the force applied by a user to disk 35, FIG. 2 depicts a cross section of the construction of device 10 taken along line 2—2 of FIG. 1 (Note: that the cross section of FIG. 2 is depicted without the partial cut away of disk 35 illustrated in FIG. 1 ). As shown in FIG. 2, actuation element 35 is actually composed of several structures. Disk 35 is approximately one and one half inches in diameter and has a relatively smooth top. This particular configuration enables the user to comfortably slide a digit (usually the thumb) on the surface of disk 35 while applying appropriate downward action (i.e. force or motion) to disk 35. The underside of disk 35 can be hollowed out so that it can be readily fabricated by injection molding. Additionally, ribs could be added on the underside of disk 35 to provide additional strength. Pivot element 40 depends from the center of the bottom of disk 35 towards base 25. The bottom of pivot 40 can be shaped to provide mechanically preferred actuation directions if desired. For example, a simple pivot 40 would have a square cross-section and a slight flat on its bottom. This configuration of pivot 40 would make it easy for a user to tilt disk 35 in on of the four main directions (North, South, East and West), yet the user could still move disk 35 in ran off axis direction (e.g. Northeast). With an octagonal pivot 40, 45° off-axis directions of motion could also be included as preferred directions.

At the periphery of disk 35, an annular flange 45 depends perpendicularly from disk 35 towards base 25. The length of this flange 45 in the preferred embodiment of the present invention is approximately ⅜", but can be longer or shorter depending on the configuration of the remainder of the mechanical components of device 10. One mechanical function of flange 45 is to prevent disk 35 from falling out of housing 30. The additional functions of flange 45 will be detailed below in the discussion of the operation of device 10. An annular seat or ledge 50 protrudes perpendicularly from flange 45 (parallel to the top of disk 35). Seat 50 provides a surface on disk 35 against which a biasing spring 55 acts. Biasing spring 55 can be a stamped metal spring which acts against both housing 30 and seat 50. The tension of spring 55 alone is enough to retain the spring in its proper position. Other ways of incorporating a biasing spring are also possible For example pivot post 40 could be manufactured as hollow cylinder, in which is disposed a tightly wound extension spring. The biasing spring would extend out of post 40 and be mated into a boss which is formed either on base 25 or the lower part of the case of device 10 (not shown). The tensioning of such a biasing spring will cause a preloading of disk 35 to its center (neutral position).

One purpose of spring 55 is to bias disk 35 downward so that its pivot 40 is in constant contact with printed circuit board 25. Another function of spring 55 is to provide mechanical resistance or "feel" to device 10 as a user applies force to disk 35. The displacement of disk 35 may or may not be uniquely related to the amount of force applied by a user to disk 35. For example, the restoring spring 55 can have a stiffening constant or a softening characteristic. Furthermore, the "feel" of the device can be tuned through the variation of the mechanical impedance of the assembly. Spring 55 also provides a centering function in which it biases disk 35 to a neutral position (the position of disk 35 shown in FIG. 2). After a force has been applied by a user to disk 35, the action of spring 55 on seat 50 and housing 30 will return disk 35 to its neutral position. The choice of materials and properties for spring 55 is at the discretion of the designer. The design criteria in the choice of materials for spring 55 include, for example, the relative stiffness of the spring material (i.e., its resist to compression), the time it takes the spring to decompress (i.e., its internal damping), the compression set characteristics and the expected cycle lifetime of the spring (i.e., how many cycles of compression and decompression will the spring endure before degradation of its characteristics). With regards to the compression set characteristics, it is desirable to have a spring which will not experience permanent deformation of its shape if it is under compression for some period of time. In one application of the present invention, a fast action electronic game environment, it is preferable to have a spring 55 which has low internal damping and will return quickly to its neutral position.

As seen in FIG. 2, both photoemitter 15 and photodetector 20 are edge mounted (perpendicular) to circuit board 25 such that their operating surfaces are facing each other. In the neutral position of disk 35, flange 45 will block a portion of the light 60 from photoemitter 15 from being received by photodetector 20. In the preferred embodiment, the percentage of light 60 blocked by flange 45 in the neutral position should be approximately 50% of full range of light which can be detected by photodetector 20. In operation, as a user applies pressure to disk 35 (at any point except its exact center) it will rock on pivot element 40. As disk 35 pivots on pivot element 40, flange 45 will be displaced from its neutral position and act as light shutter, or interrupter, and either allow more or less light 60 from photoemitter 15 to be received by photodetector 20.

Figure 3A:
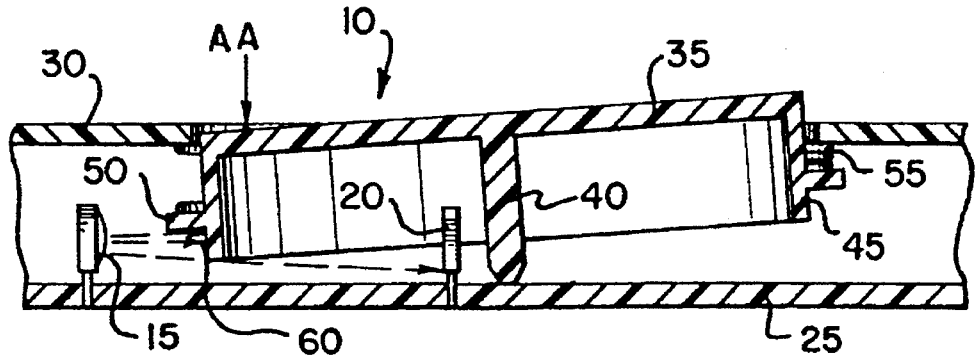
FIGS. 3A and B illustrate the device shown in cross section in FIG. 2 when a user has applied a force to the device.

FIG. 3A illustrates the orientation of disk 35 when a user has applied a force on disk 35 in the downward direction as indicated by arrow A. As the user applies this force, disk 35 will flit, and the portion of flange 45 in this area will be displaced towards base 25. By this process, flange 45 will occlude more of light 60 from emitter 15 than is occluded when disk 35 is in its neutral position. The portion of ledge 50 on the opposite side of disk 35 acts as a mechanical stop when spring 55 becomes fully compressed as depicted in this Figure. Alternatively, the length of flange 45 can be increased such that the bottom of flange 45 comes into contact with base 25 and acts as a mechanical stop. This alternative (not depicted in the Figures) has at least two advantages. First, more of light 60 from emitter 15 will be occluded if flange 45 contacts base 25 at its extreme in travel. Second, it is not preferable to fully compress biasing spring 55, as full compression will tend to degrade the operating characteristics and life of spring 55.

Figure 3B:
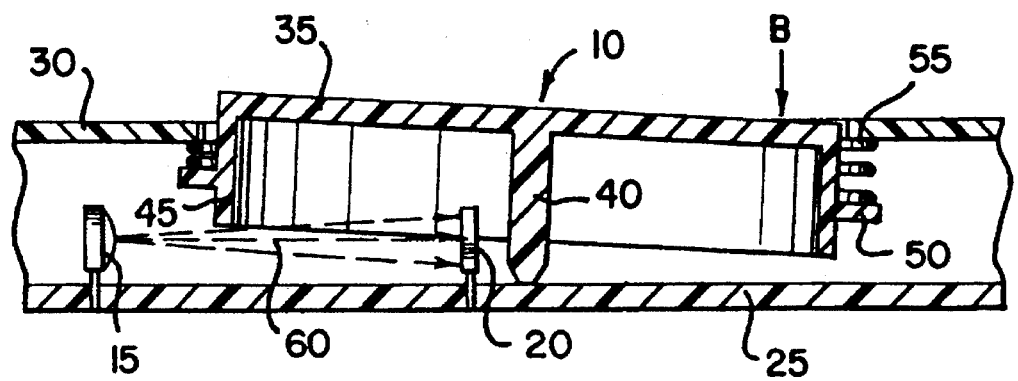

FIG. 3B illustrates the orientation of disk 35 when a user has applied a force on the opposite side of disk 35 as indicated by arrow B. Similar to the orientation described in FIG. 3A, as the user applies the force in direction B, disk 35 will tilt, and the portion of flange 45 in this area will be displaced towards base 25. Simultaneously, the portion of flange 45 on the opposite side (the portion described with respect to FIG. 3A) will rise away from its neutral position (FIG. 2) and allow more light 60 from photoemitter 15 to be incident on photodetector 20.

Using the particular devices for photoemitter 15 and photodetector 20 described above, when disk 35 is in its non-tilted neutral position (FIG. 2), the output of photodetector 20 was experimentally found to be 140 millivolts ±20 millivolts. When disk 35 was displaced to its maximum physical extreme (i.e., photodetector 20 was receiving the maximum amount of light) the output of photodetector 20 was found to be 285 millivolts ±60 millivolts. When disk 35 was displaced to its other physical extreme (i.e., photodetector 20 was receiving the minimum amount of light) the output of photodetector 20 was found to be essentially zero. The tolerances experienced during this limited experimentation would be greatly reduced in a production version of device 10 by carefully regulating the geometric consistency of the manufactured parts of device 10.

In the embodiment of the present invention described in connection with FIGS. 1–3B, there has only been one photoemitter/photodetector arrangement (elements 15 and 20 in these Figures). Having a single photoemitter/photodetector combination will only allow detection of a user's input along one axis of tilt of the disk 35. In the embodiment depicted in FIGS. 1–3B, this would be the East-West axis of tilt of actuator disk 35. Device 10, as configured in these Figures, would not be able to detect any displacement of disk 35 due to a force applied by the user along the North-South axis of tilt of disk 35. One way of detecting the North-South tilt of disk 35 would be to duplicate the emitter/detector arrangement already described, except that the duplicate arrangement would be positioned (not shown in the Figures) along the North-South axis of disk 35. The second arrangement of emitter/detector would be displaced orthogonally (90°) to the axis created by photoemitter 15 and photodetector 20. Merely placing a second emitter/detector combination along the second axis however, is not the preferred method for obtaining measurements along the second axis. The main problem with this simple approach is that of cross-talk between the two axes. That is, for the approach to work appropriately, the light from an emitter in one axis must somehow be shielded extremely well from the detector positioned along the orthogonal axis. Otherwise, the detector would not be able to distinguish between the light from its corresponding emitter and the orthogonally placed emitter. Typically, the shielding would be accomplished with a complex baffling arrangement on the bottom side of disk 35 and on the portion of base 25 which resides under disk 35.

One solution to prevent cross talk between two emitter/detector combinations is to place the two combinations of emitters and detectors 90° apart as described above, but the light from the two emitters is time division multiplexed. In this embodiment, the two photodetectors act as synchronous detectors. The photodetectors will only provide output when its corresponding emitter is tamed on. Such an implementation thus eliminates the need for baffling between the optical paths of the two axes since only one of the light sources will be emitting light at any given time, and only one photodetector will be enabled at that time. A further improvement on this solution eliminates the need for one of the photodetectors and is depicted in FIG. 4.

Figure 4:
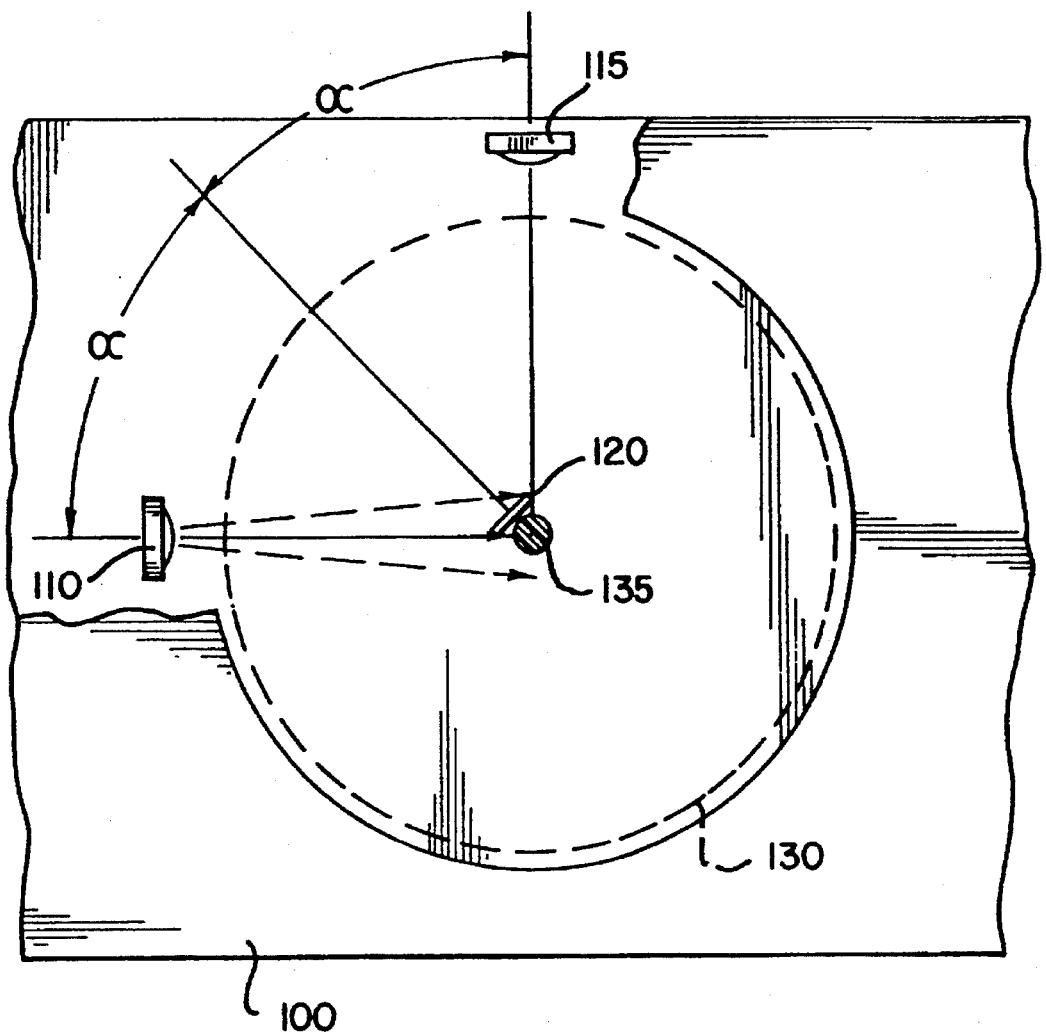
FIG. 4 is a plan view of a preferred embodiment of the present invention using two photoemitters and one photodetector.

FIG. 4 is a plan view of a circuit board 100 for an embodiment of the present invention which includes two photoemitters, 110 and 115, and only one photodetector 120. Circle 130 represents the footprint of disk 35 (FIGS. 1–3B) on base 100, while circle 135 represents the footprint of pivot element 40 (FIGS. 2–3B). The two light sources 110 and 115 are positioned along orthogonal axes with respect to each other and the center of footprint 130 of disk 35. Each light source, 110, 115 is alternately pulsed at a rate of several kilohertz or higher and has a 50% duty cycle. A square wave or other suitable signal pattern can be used for the pulsing of the emitters. The circuitry used to perform the time division multiplexing is conventional and is shown in FIG. 7. As a result of the time division multiplexing, one light source is on (e.g., emitter 110), while the other light source is off (e.g., emitter 115). As shown in FIG. 4, only one detector 120 is needed to detect the light from both emitters, 110 and 115. The use of a single detector 120 represents a significant cost savings, not only in the cost of the actual detector part which is saved, but also the associated circuitry. As described above with respect to FIG. 2, detector 120 and emitters 110 and 115 are mounted to base 100 standing on their respective edges. Detector 120 is mounted such that the normal to its operative surface is oriented to an angle α, half way between the beams of the two light sources 110 and 115 (i.e., α=45°). Thus, the response of detector 120 to each light source 110, 115 is balanced.

Figure 5:
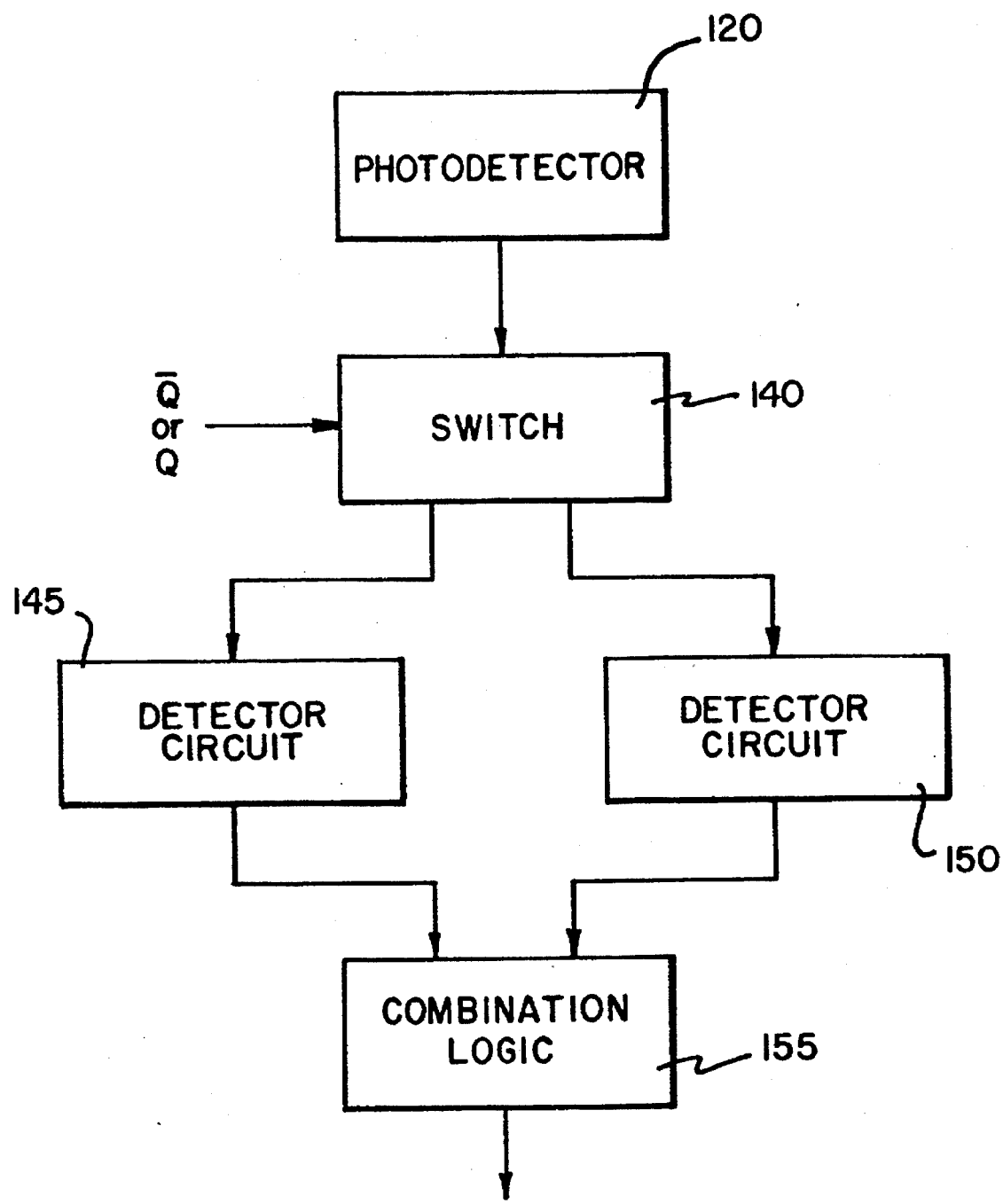
FIG. 5 is a block diagram of the output circuitry used in conjunction with the embodiment of the present invention depicted in FIG. 4.

As shown in the block circuit diagram of FIG. 5 and the more detailed circuit diagram of FIG. 6, the output from photodetector 120 is gated back and forth between two filter/amplifier circuits 145, 150 ("detector circuits") via switch 140. Each of the detector circuits 145, 150 will respectively measure one of the axes of tilt of actuator disk 35. For example, detector circuit 145 might measure tilt for the East-West axis of disk 35, while detector circuit 150 would measure the tilt of disk 35 along the North-South axis. The actual design of the filter and amplifier components in detector circuits 145 and 150 is conventional and has not been explicitly illustrated FIG. 5. The filter could simply be a capacitor which is used to hold up the voltage of the output signal as shown in FIG. 6. It was experimentally found that a value of 0.1 picofarads for both C1 and C2 adequately performed the filtering operation. The amplifiers (not shown) are used to bring the output voltage from the photodetectors to a useful level for further processing. The amplifiers perform the additional function of buffering the photodetector output signal.

The gating or enable signal Q or $\overline{Q}$ into switch 140 (FIGS. 5 and 6) originates from the logic which generates the pulses driving the two emitters 110 and 115 as shown in FIG. 7. The circuit shown in FIG. 7 is a standard clock generation circuit using standard inverters where R1=R2=47K ohms and C1=0.1 microfarads. The signals Q and $\overline{Q}$ are simultaneously fed from the clock circuit of FIG. 7 to the LED driving circuits as shown in FIG. 8. Only one LED driving circuit is shown in this Figure, but if there are two LEDs in the system, two such circuits would be provided (one being driven by Q and the other being driven by $\overline{Q}$). Having the same signals Q and $\overline{Q}$ driving the LEDs (FIG. 8) and controlling switch 140 (FIGS. 5 and 8) ensures that the output from photodetector 120 is synchronously gated to the appropriate detector circuit, 145 or 150, at the appropriate time. For example, if detector circuit 145 generates the output representing the East-West tilt of disk 35, then the gating signal enables switch 140 to direct the output of photodetector 120 to detector circuit 145 when emitter 110 is mined on (see FIG. 4). Conversely, when photoemitter 115 (FIG. 4) is emitting light, the output from photodetector 120 is directed to detector circuit 150 via switch 140. In this example, detector circuit 150 will represent the North-South tilt of actuator disk 35. The outputs from each of two detector circuits 145, 150 respectively represent the relative motion of disk 35 along one of its two axes of tilt. Each of the outputs from detector circuits 145 and 150 range between a positive and a negative voltage. The output range experienced by one or the other of detector circuits 145 and 150, could be changed by adding an offset voltage. The outputs from the two detector circuits 145 and 150 respectively represent a magnitude of the tilt of disk 35 resulting from a force applied by a user along one of the two axes of tilt of actuation disk 35. These two outputs can independently be processed by a system to which device 10 is attached or alternatively, the two outputs can be converted by conventional means into a single directional angle and magnitude vector by combination logic 155 or can be delivered in rectangular coordinates. The combination logic 155 can either process the outputs from the photodetector in analog form, or the outputs can be digitized and process the signals with digital circuitry.

As an alternative to the configuration of components depicted in FIG. 5, the output circuit which is connected to photodetector 120 can be accomplished using a single detector circuit (145 or 150). In this alterative configuration (not shown in the Figures), the detector circuit (145 or 150) is directly connected to the photodetector 120 and the output of the detector circuit is fed to switch 140. The gating signal Q or $\overline{Q}$ still enables switch 140, but instead of switching the output from photodetector 120 to the detector circuits (145 and 150), it switches the output from the single detector circuit (145 or 150) to the combination logic 155 or whatever other external connections are made to device 10. In this alterative embodiment, the detector circuit (145 or 150) samples the output of photodetector 120 at a much higher rate than the driving frequency of the photoemitters. In this manner the single detector circuit (145 or 150) will be able to derive stable signals from photodetector 120 at the appropriate time when one or the other of the photoemitters is mined on. When the other photoemitter is turned on, the same detector circuit (145 or 150) will begin processing data indicative of the light from that photemitter and signal Q or $\overline{Q}$ will enable switch 140 and the proper data will flow out of the output circuit.

Figure 9:
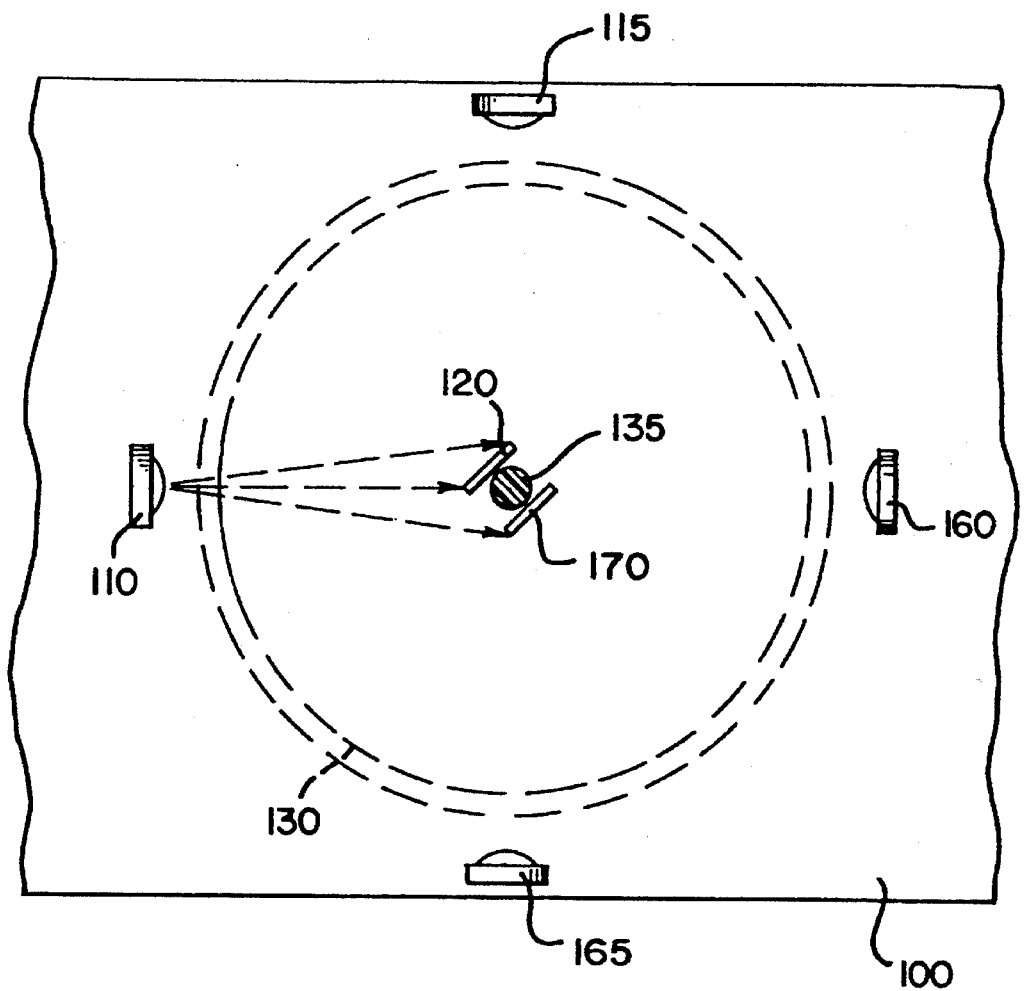
FIG. 9 is a plan view of a preferred embodiment of the present invention using four photoemitters and two photodetectors.

A further embodiment of the present invention is depicted in FIG. 9 which adds additional components, and likewise additional cost to the assembly depicted in FIG. 4. In this embodiment., four light emitters 110, 115, 160 and 165 are employed as opposed to two ( 110 and 115 in FIG. 4 ). These four emitters 100, 115, 160 and 165 are equally spaced around, and outside the circumference of footprint 130 of disk 35. The light beam from each emitter is directed toward the center of footprint 130 (i.e., towards footprint 135 of pivot element 40). In this embodiment, light from each source 110, 115, 160 and 165 is time division multiplexed such that each source has a duty cycle of 25% and only one emitter is turned on at any given time. In the simplest construction of this embodiment, two photodetectors 120 and 170 are used. Photodetector 120 is installed as described above with respect to FIG. 4. Photodetector 170 is similarly mounted, facing in the opposite direction of detector 120 (i.e., such that it is Capable of receiving light from emitters 160 and 165).

Figure 10:
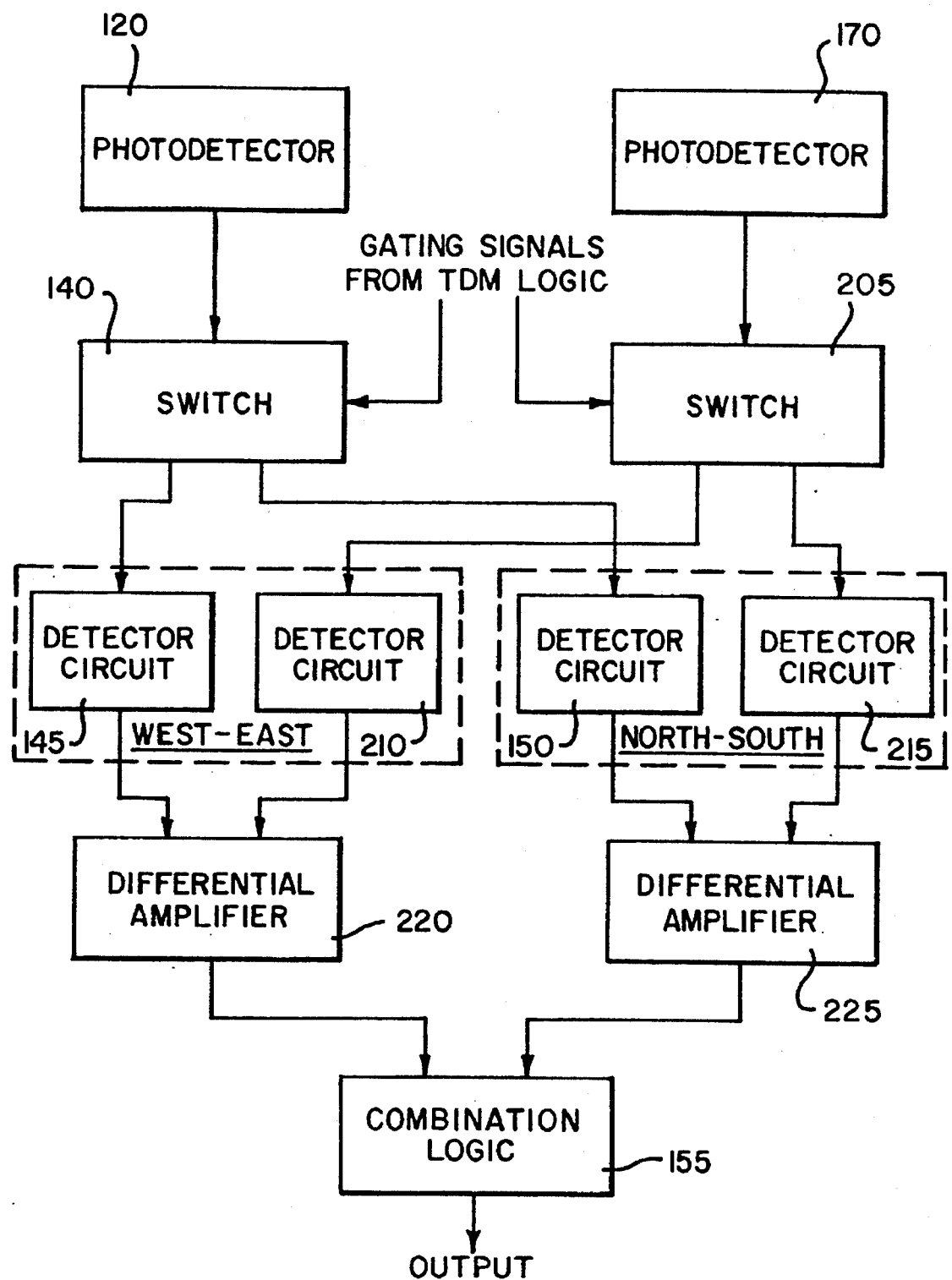
FIG. 10 is a block diagram of the output circuitry used in conjunction with the embodiment of the present invention depicted in FIG. 9.

As shown in the block circuit diagram of FIG. 10, the outputs from photodetectors 120 and 170 are gated to four filter/amplifier circuits, 145, 150, 210 and 215 ("detector circuits") via switches 140 and 205. Since each detector 120 and 170 measures flight from two different emitters on two different axes, there are two detector circuits for each photodetector 120, 170. Each of the detector circuits 145, 150, 210 and 215 respectively measure one direction of tilt of actuator disk 35 for one axis. In the particular embodiment depicted in FIGS. 9 and 10 the detector circuits 145, 150, 210 and 215 could be configured such that detector circuit 145 measures tilt in the West direction, detector circuit 210 measures tilt in the East direction, while detector circuits 150 and 215 respectively measure tilt in the North and South directions. The configuration of the detector circuits 145, 150, 210 and 215 is a function of the timing of the gating signals. For example, since photodetector 120 measures tilt in both the West and North directions, detector circuit 145 (which is connected m detector 120) could be enabled to process measurements from either direction. The particular direction for which it actually processes data is determined by the gating signal which tells switch 140 when to send photodetector 120 data to detector circuit 145. If it is desired that detector circuit 145 process West data, then the gating signal will be timed such that switch 140 will pass photodetector 120 data to detector circuit 145 when emitter 110 (FIG. 9) is turned on. If the gating signal is configured as just described, then detector circuit 150 will process North data (i.e. light detected by detector 120 from emitter 115).

The gating of detectors 120 and 170 occurs in synchronism with the pulses driving the four emitters 110, 115, 160 and 165. The four detector circuits 145, 150, 210 and 215 generate four output signals which completely describe the tilt of actuator disk 35. Detector circuits which measure tilt in opposing directions (e.g., West and East) can be combined to more accurately describe the tilt of actuator disk 35 along that axis. In the embodiment depicted in FIG. 10, detector circuit 145 measures tilt in the West direction (from detector 120) while detector circuit 210 measures tilt in the East direction (from detector 170). The combination of the outputs of these two detector circuits 145, 210 for opposing directions along the same axis of tilt, fully describes the tilt of actuator disk 35 along the West East axis. For example, if a user tilts disk 35 downward in the West direction (i.e., blocking light from emitter 110 (FIG. 9)), the amount of light received by detector 120 will decrease from the amount of light received when actuator disk 35 is in its neutral position. The decrease in the amount of light received by detector 120 results in a decrease in the output from detector circuit 145. While the user is still tilting disk 35 in the West direction, emitter 160 (FIG. 9), on the opposite side of disk 35, will be pulsed (two pulse cycles later) and the amount of light detected by its corresponding detector 170 will increase from the amount of light received by this detector 170 when actuator disk 35 is in its neutral position. This will result in an increase in the output signal from the detector circuit 210 for detector 170.

In theory, the output of a single detector circuit for one direction should be inversely proportional to output of the detector circuit for the opposite direction. In practice, due primarily to the tolerances of the emitter and detector components, the inverse proportionality is not exact. It is therefore preferable (from an accuracy standpoint, not from a manufacturing or cost standpoint) to use two opposing photodetectors as depicted in FIG. 9 and combine the two outputs from the two associated detector circuits to derive a single measurement for a particular axis of tilt. As shown in FIG. 10, the two outputs from a pair of detection circuits for a particular axis of tilt are combined using differential amplifiers 220 and 225. Differential amplifier 220 combines the outputs from detection circuits 145 and 210 for the West-East axis, while differential amplifier 225 combines the outputs from detection circuits 150 and 215 for the North-South axis.

Figure 11:
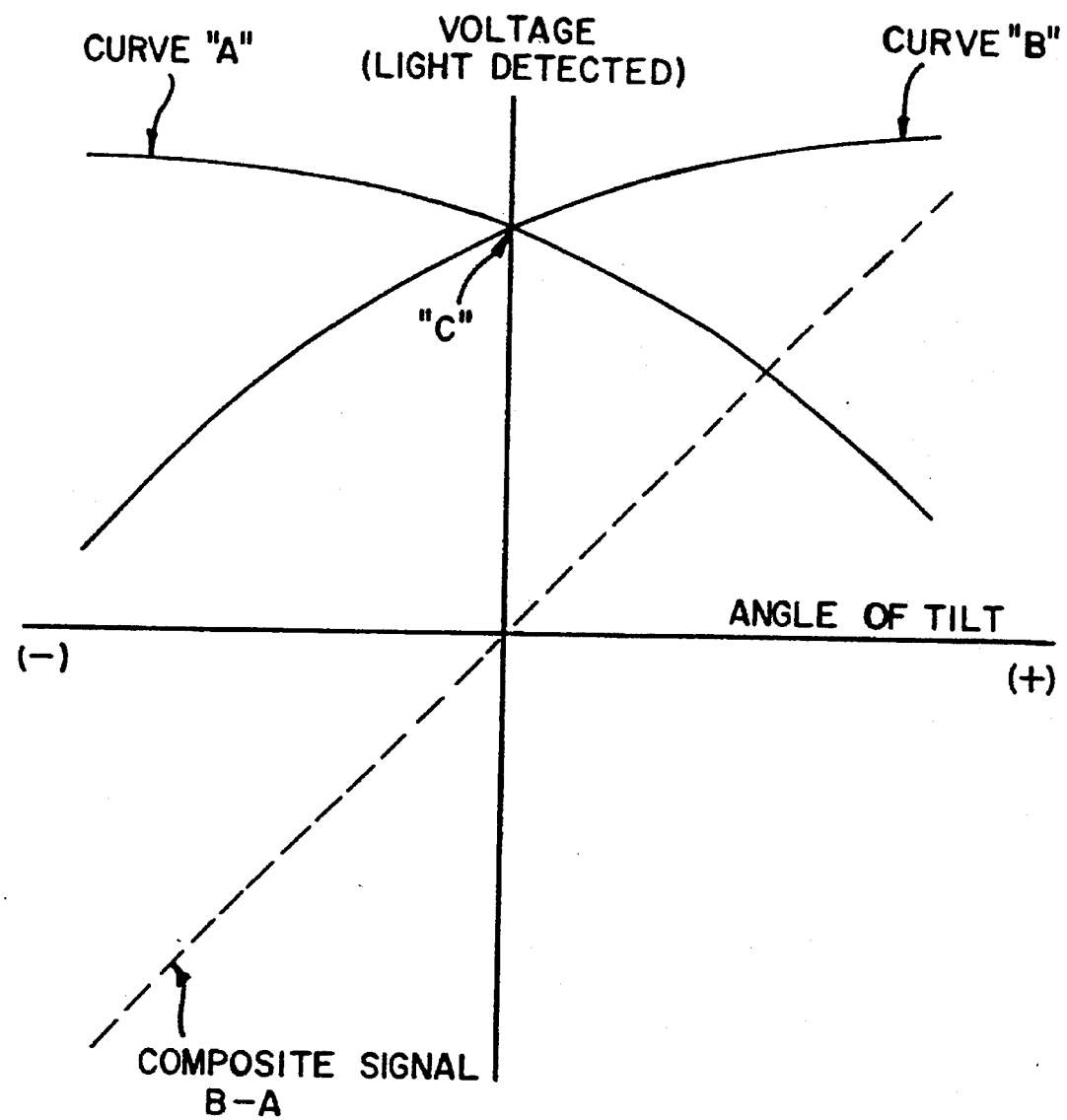
FIG. 11 is graphical illustration of the amount of light received from opposing photoemitters as a function of the angle of tilt of the actuation element.

FIG. 11 illustrates the relationship between the outputs of detector circuits for the same axis of tilt. In this Figure, curve A represents the output voltage of one of the detector circuits (detector circuit 145 for example), while curve B represents the output voltage of the detector circuit on the same axis of tilt. but on the opposite side of actuation disk 35 (detector circuit 210, for example). The output voltage of the detector circuits (vertical axis of the graph), representing the amount of light received by the detector circuit's associated detector (detector 120, for example), is plotted against the angle of tilt of actuator 35 (horizontal axis of the graph) along the particular axis of measurement (West-East axis, for example). Neither curve A nor curve B is linear, and both have maximum and minimum output voltages as previously described.

These curves, A and B, represent the general characteristics of the output voltages which are exhibited from detector circuits 145, 150, 210 and 215, but it should be noted that every detector circuit will not output the ideal curves depicted in FIG. 11. For example, the actual curves from a particular detector circuit might be steeper or flatter in a particular area, or the zero crossing of the x axis might be higher or lower. The voltage indicated at point C On the graph (zero crossing of the x axis) is the output voltage of the detector circuits when the actuator disk 35 is in its neutral position (i.e., no force is being applied to disk 35). As stated above, the curves depicted in this graph represent the general characteristics of the detector circuits, therefore in practice, the output voltages for actual detector circuits when most likely have different levels of output voltage when disk 35 is in its neutral position. From an implementation standpoint, it preferable to have a small deadband region surrounding the neutral position of disk 35 (the vertical axis crossing). The reason for this deadband region is m allow a user to have a finger positioned on disk 35. With the incorporation of a deadband, the system will not register small changes in the displacement of the disk 35 due to small and inadvertent movements by the user's finger.

The dotted line depicted in FIG. 11 represents the combination of the two outputs (curve A and curve B)as seen at the outputs of the differential amplifiers 220, 225 of FIG. 10. The differential amplifier (220, for example) causes the subtraction of one of the output signals from the other (curve A from curve B as depicted in FIG. 11 ) and yields the composite signal shown by the dotted line in the Figure. The composite signal has the following properties: b 1) aging of the components (primarily the emitters 110, 115, 160, 165 and the detectors 120 and 170 (FIG. 9)) will not cause a shift of the output voltage of detector circuits 145, 150, 210 and 215 when actuator disk 35 is in its neutral, untilted position; 2) pushing down on the center of actuator disk 35, causing a downward deflection, will not cause a shift of the output voltage. This is because each of the output voltages of detector circuits in opposite directions along the same axis of flit will vary by approximately the same amount. Thus, the difference between them will remain substantially unchanged; 3) the range of the composite signal runs between negative and positive voltages of approximately the same magnitude, therefore no offsets need to be added via circuitry; and 4) the graph of composite signal versus tilt will be substantially a linear function, as opposed to the curves exhibited by a single detection circuit. The effect of subtracting one signal from the other results in a composite signal that exhibits much less curvature.

One further improvement that should be noted here is the ability to use four emitters with a single detector. In order to do so, the detector arrangement employed must somehow allow for pivoting of disk 35. At the same time, the light from each of the four emitters should impinge on the single detector in a balanced manner. At least two possibilities would accomplish these two functions. One method would be to change the design of the pivot mechanism for actuator disk 35 to allow for a central mounting of the single detector. The second method is to use a light pipe (clear plastic), appropriately shaped to equally collect light from both sides of a central pivot (as depicted by pivot 40 in FIG. 2), and guide the collected light to a single detector.

The present invention includes some significant manufacturing and reliability advantages over the prior art devices. In the present invention there are no mechanical switch contacts to wear out. Device 10 can be constructed quite rugged and reliable and is relatively immune to the presence of dirt and moisture. The cost of manufacturing device 10 is relatively low. The manufacture of device 10 is very simple. The allowable positional tolerances of some of the components are quite high, while the tolerances for the remainder of the components are easily accomplished and well thin the realm of standard manufacturing practices. Finally, the construction of device 10 is a "stacked" assembly which is ideally suited to simple and cost effective manufacturing.

The embodiments described above clearly realize the stated objects of the invention, yet are not intended as an exhaustive compilation of the invention's content of patentable novelty. Numerous further variants will be obvious and may be effected by anyone skilled in the art without departing from the scope or spirit of the invention.

I claim:

1. An electro-optical input device comprising:

a base;

an actuation disk pivotally disposed on said base to support tilting of said actuation disk with respect to said base, said actuation disk having top and bottom sides;

at least one photoemitter disposed on said base;

at least one photo detector disposed on said base; and a flange depending from said bottom side of said actuation disk, said flange projecting a footprint on said base, said flange being positioned on said bottom side of said actuation disk such that said footprint falls between said photoemitter and said photodetector.

2. An electro-optical input device according to claim 1 further comprising:

a biasing means for biasing said actuation disk to a neutral position.

3. A device according to claim 1, further comprising:

control means connected to said at least one photoemitter, for providing on/off control signals to said at least one photoemitter.

4. A device according to claim 3, further comprising:

a second photoemitter position approximately 90° from said at least one photoemitter.

5. A device according to claim 4, wherein said on/off control signals from said control means are time division multiplexed between said at least one photoemitter and said second photoemitter.

6. A device according to claim 5, further comprising an output circuit connected to said at least one photodetector.

7. A device according to claim 6 wherein, said control means further provides a gating signal to said output circuit, said gating signal indicating which of said photoemitters is on.

8. A device according to claim 7, wherein said output circuit comprises a switch and at least one filter circuit, said at least one photodetector being connected to said switch, said switch being connected to said at least one filter circuit.

9. An electro-optical input device comprising:

a base;

an actuation disk having top and bottom sides and a marginal edge;

a pivot post depending from said bottom side of said actuation disk, said actuation disk being pivotally disposed on said base at a pivot point to support tilting of said actuation disk with respect to said base;

a flange depending from said bottom side of said actuation disk between said pivot post and said marginal edge, said flange projecting a footprint on said base;

at least one photoemitter disposed on said base on an opposite side of said flange footprint from said pivot point; and at least one photodetector disposed on said base between said flange footprint and said pivot point.

10. A device according to claim 9, further comprising:

a second photoemitter positioned approximately 90° from said at least one photoemitter with respect to said pivot point, said at least one photodetector being oriented on said base so as to receive light from said at least one photoemitter and said second photoemitter.

11. A device according to claim 10, further comprising:

an output circuit connected to said at least one photodetector; a control circuit connected to said at least one photoemitter, said second photoemitter, and said at least one photodetector, said control circuit providing time division multiplexed on/off control signals to said photoemitters and at least one enable signal to said output circuit.

12. A device according to claim 10, further comprising:

third and fourth photoemitters positioned approximately 90° from each other, said at least one photoemitter and said second photoemitter respectively; and a second photodetector disposed on said base on an opposite side of said pivot point from said at least one photodetector.

13. A device according to claim 12, further comprising:

a first output circuit connected to said at least one photodetector;

a second output circuit connected to said second photodetector;

a control circuit connected to said at least one photoemitter, said second third and fourth photoemitters, said at least one photodetector and said second photodetector; and said control circuit providing time division multiplexed on/off control signals to each of said photoemitters and at least one enable signal to said output circuits.

14. A method of operating an electro-optical input device, said input device having at least two photoemitters and at least one photodetector, said photodetector being connected to an output circuit, said method comprising:

generating time division multiplexed control signals:

providing said control signals to said at least two photoemitters for alternately turning on one of said at least two photoemitters;

providing said control signals to said output circuit;

sampling said at least one photodetector in response to said control signals; and generating an output signal corresponding to light detected from the photoemitter which is turned on.

15. A method according to claim 14 further comprising:

filtering said output of said at least one photodetector; and amplifying said output filtered of said at least one photodetector.

16. A method according to claim 14 wherein said input device has at least four photoemitters, said method comprising:

providing said control signals to said at least four photoemitters for sequentially turning on one of said at least four photoemitters.

17. A method according to claim 16 wherein said input device has a second photodetector connected to a second output circuit, said method further comprising:

providing said control signals to said second output circuit; and sampling said second photodetector in response to said control signals.

* * * * *